US006938233B2

(12) United States Patent
Satoh et al.

(10) Patent No.: US 6,938,233 B2
(45) Date of Patent: Aug. 30, 2005

(54) METHOD AND APPARATUS FOR DESIGNING SEMICONDUCTOR INTEGRATED CIRCUIT DEVICE BASED ON VOLTAGE DROP DISTRIBUTION

(75) Inventors: Kazuhiro Satoh, Neyagawa (JP); Nobufusa Iwanishi, Hirakata (JP); Noriko Ishibashi, Mishima-gun (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/637,254

(22) Filed: Aug. 8, 2003

(65) Prior Publication Data

US 2004/0031008 A1 Feb. 12, 2004

(30) Foreign Application Priority Data

Aug. 9, 2002 (JP) ........................................ 2002-233787

(51) Int. Cl.[7] ............................................ G06F 17/50
(52) U.S. Cl. ................... 716/10; 716/8; 716/9
(58) Field of Search ................... 716/10, 8, 9

(56) References Cited

U.S. PATENT DOCUMENTS

| 5,872,724 A | | 2/1999 | Nakada ........................ 703/15 |
| 5,880,613 A | * | 3/1999 | Ishihara ....................... 327/202 |
| 6,090,150 A | * | 7/2000 | Tawada ........................ 703/19 |
| 6,202,196 B1 | | 3/2001 | Huang et al. .................. 716/14 |
| 6,523,154 B2 | | 2/2003 | Cohn et al. ..................... 716/6 |
| 6,799,310 B2 | * | 9/2004 | Miyamoto .................... 716/10 |
| 2002/0083403 A1 | | 6/2002 | Murayama ...................... 716/5 |

FOREIGN PATENT DOCUMENTS

| JP | 9-181185 | 7/1997 | ........... G06F/17/50 |
| JP | 11-45979 | 2/1999 | |
| JP | 2000-163460 | 6/2000 | |
| JP | 2000-194732 | 7/2000 | |
| JP | 2002-110802 | 4/2002 | ........... G06F/17/50 |

OTHER PUBLICATIONS

Irwin et al.,"Energy Efficient System Design", Fall 2000, Det. of CSE, Microsystems Design Lab., Penn State University, CSE 597C, view graphs, Sources of Energy 1–28, pp. 1–14.*

* cited by examiner

Primary Examiner—A. M. Thompson
Assistant Examiner—Sun James Lin
(74) Attorney, Agent, or Firm—Hamre, Schumann, Mueller & Larson P.C.

(57) ABSTRACT

A method for designing a semiconductor integrated circuit device for connecting between terminals of transistors formed on a silicon wafer by metal wiring. The method includes a first step of carrying out a schematic arrangement so as to minimize a distance of a wiring for connecting between the transistors or wiring capacitance based on input information on transistors; a second step of producing information on a voltage drop value based on the schematic arrangement of the transistors; and a third step of arranging the transistors based on the information on a voltage drop value.

13 Claims, 11 Drawing Sheets

| 2 | 2 | 2 | 2 | 2 | 2 | 2 | 2 | 2 | 1 |
|---|---|---|---|---|---|---|---|---|---|
| 3 | 4 | 8 | 7 | 8 | 9 | 9 | 6 | 6 | 2 |
| 2 | 7 | 11 | 15 | 18 | 19 | 17 | 10 | 8 | 2 |
| 2 | 9 | 12 | 18 | 25 | 26 | 23 | 18 | 10 | 2 |
| 2 | 10 | 15 | 20 | 25 | 30 | 25 | 20 | 10 | 2 |
| 2 | 7 | 12 | 19 | 22 | 25 | 24 | 18 | 12 | 2 |
| 2 | 6 | 10 | 18 | 19 | 20 | 20 | 16 | 11 | 2 |
| 2 | 5 | 8 | 17 | 16 | 15 | 13 | 14 | 10 | 2 |
| 2 | 4 | 7 | 16 | 13 | 10 | 8 | 10 | 7 | 2 |
| 1 | 3 | 5 | 15 | 10 | 5 | 6 | 6 | 6 | 1 |

METHOD AND APPARATUS FOR DESIGNING SEMICONDUCTOR INTEGRATED CIRCUIT DEVICE BASED ON VOLTAGE DROP DISTRIBUTION

BACKGROUND OF THE INVENTION

1. Field of the Invention

The present invention relates to a method and apparatus for designing a semiconductor integrated circuit device. In particular, it relates to a method and apparatus for arranging transistors or cells, that is, a transistor assembly having a logic function in consideration of a voltage drop value.

2. Description of the Related Art

Recently, a manufacturing process of semiconductor has rapidly been finer, and the scale of a transistor has significantly been increased. Accordingly, also power consumption of a semiconductor chip unit is rapidly increased. Therefore, at the present time, it is desired to suppress the increase in power consumption as much as possible by, for example, reducing supply voltage (operating voltage), etc.

In this way, by reducing a voltage supply in order to suppress the increase in power consumption, a value of electric current is increased. Then, with such an increase in the value of electric current, the circuit operation may be adversely affected. In order to cope with such a problem accompanying a voltage drop in a semiconductor chip, for example, JP 11 (1999)-45979A discloses a method for reducing a voltage drop. JP 2000-194732A discloses a method for exactly analyzing a voltage drop value. On the other hand, JP2000-163460A discloses a method for reducing a voltage drop itself while analyzing a voltage drop.

In the above-mentioned method for analyzing and reducing a voltage drop, an analysis of power consumption and the voltage drop value is conducted with respect to transistors or cells which are substantially or perfectly arranged. Then, by verifying the timing with the use of a transistor delay corresponding to the voltage drop value, the occurrence of an operation defect after manufacturing is suppressed or the suitable power supply wiring is reinforced in order to reduce the rate of the voltage drop.

However, it is not possible to avoid the occurrence of a voltage drop to some extent and, in general, a certain amount of a voltage drop, which may be generated, is included in the design as a design margin of the entire circuit. That is, when it is estimated that the voltage drop of 10% occurs, a circuit design with higher speed by 10% than the usual specification is carried out. Thus, even if a voltage drop occurs, the operation speed in accordance with specification can be secured.

Since such a designing method is employed, based on the timing verification on a circuit, cells belonging to a path having a relatively large timing margin have the same power supply reinforcement as cells belonging to the critical path. This causes an unnecessary increase in the area of the chip.

Furthermore, in carrying out a logic synthesis, in general, since the process such as a logic synthesis is carried out assuming an ideal clock, even if a path from a clock source to each flip-flop is an isometry wiring or isovolume wiring, delay distribution occurs due to the influence of a voltage drop. Therefore, the clock delay distribution (skew) margin to be included at the time of synthesis is necessary to be included in a significant margin design by considering the most of a voltage drop distribution in addition to a functional wiring length of an arranged wiring tool and a wiring capacitance control distribution.

Then, even if such a timing margin is reduced and the timing optimization by real dock delay information is executed after the wiring is finished, since the configuration of the circuit is changed and thus the voltage drop value differs from that before the timing optimization is carried out, the timing optimization process may not be converged.

Furthermore, in a test circuit (scan circuit) for detecting a failure place in a circuit, since in general, scan chain assuming an ideal clock is carried out, a voltage drop may be maximum at the time of scan operation, and thus a failure detection test cannot be carried out because of the clock skew by the influence of the voltage drop

SUMMARY OF THE INVENTION

It is an object of the present invention to provide a method and apparatus for designing a semiconductor integrated circuit device, which is capable of considering the influence in the case where a voltage drop value changes and suitably designing even if a distribution occurs.

The method for designing a semiconductor integrated circuit device according to the present invention connects between terminals of transistors formed on a silicon wafer by metal wiring. The method includes a first step of carrying out a schematic arrangement so as to minimize a distance of a wiring for connecting between the transistors or wiring capacitance based on input information on transistors; a second step of producing information on a voltage drop value based on the schematic arrangement of the transistors; and a third step of arranging the transistors based on the information on the voltage drop value.

The apparatus for designing a semiconductor integrated circuit device according to the present invention for connecting between terminals of transistors formed on a silicon wafer by metal wiring includes: a schematic arrangement means for carrying out a schematic arrangement so as to minimize a distance of a wiring for connecting between the transistors or wiring capacitance based on input information on transistors; a voltage drop value information producing means for producing information on a voltage drop value based on the schematic arrangement of the transistors; and a re-arrangement means for arranging the transistors based on the information on the voltage drop value.

DESCRIPTION OF THE PREFERRED EMBODIMENTS

In the method for designing a semiconductor integrated circuit device according to the embodiment of the present invention, a third step of carrying out the arrangement of transistors based on the information on a voltage drop value is included. According to such a configuration, it is possible to carry out the arrangement of cells in consideration of the increase in delay of cells due to a voltage drop. As compared with a conventional method in which a delay calculation is carried out in consideration of a voltage drop value after cells are arranged, the method according to the embodiment makes it possible to carry out a circuit optimization process for timing correction at the stage of arrangement and to shorten the designing time.

In this embodiment, it is preferable that the second step includes: carrying out a schematic wiring for connecting between the transistors which are schematically arranged; calculating a power consumption by estimating wiring capacitance based on the schematic wiring and by calculating load capacitance of each of the transistors; determining a resistance value of wired power source/ground wiring; calculating a voltage drop value from a power supply source in the case where an electric current source is connected to the resistance value of the wired power source/ground wiring based on the calculated power consumption; and determining the voltage drop distribution in the semiconductor integrated circuit device based on the calculated voltage drop value. It is advantageous because by calculating the voltage drop distribution in the semiconductor integrated circuit device, a proper arrangement of transistors can be carried out more precisely.

It is preferable that the third step includes: arranging the appropriate transistors in a place in which an arbitrary voltage drop value is assumed, based on the voltage drop distribution.

It is preferable that the third step includes: arranging an entire path between flip-flops or a pair of a flip-flop at the source side and a flip-flop at the sink side in the semiconductor integrated circuit device, in a region in which a difference of voltage drop values is small, based on information on the voltage drop value. It is advantageous because each path is set to a certain voltage drop value, so that the path delay calculation can be carried out at a certain voltage drop value and even in the case where the electrostatic timing analysis is carried out, it is possible to carry out a delay calculation at high speed in consideration of the voltage drop value.

It is preferable that the method for designing a semiconductor integrated circuit device further includes: carrying out a schematic wiring for connecting the transistors which are schematically arranged; calculating the path delay between flip-flops based on the schematic arrangement of the transistors and the schematic wiring; and comparing the calculated path delay with a limit delay time so as to determine a margin of the path delay in the path between the flip-flops. In the method, it is preferable that the third step includes: preferentially arranging the transistors included in the path having a large margin of the path delay, in a region in which a voltage drop value is large. It is advantageous because the increase in the delay of cells due to a voltage drop can be absorbed by a margin portion of the path timing, a power supply for supplementing the increase in delay of the critical path can be reinforced or the rate of the timing margin can be reduced, and the designing time can be shortened by reducing the area of a chip and by reducing the number of times of repeating a timing optimizing process for satisfying the speed of operation specification of the circuit.

It is preferable that the method for designing a semiconductor integrated circuit device further includes: building-in a test circuit for detecting a failure place of the transistor, wherein the third step includes changing the order of connecting the test circuit based on information on the voltage drop value. It is advantageous because it is possible to calculate a clock skew of each flip-flop and the data arriving time in consideration of a voltage drop, and thus it is possible to avoid in advance that after the connection of a scan chain, the limitation of a hold time is not satisfied due to a voltage drop. Therefore, even if a dock tree route to a flip-flop for scanning is different, it is possible to avoid, in advance, the problem that a clock skew due to a voltage drop is increased so as to cause a hold time error and the trouble shooting process cannot be carried out. Consequently, LSI capable of operating normally, which has a problem only in a failure verification process, can be delivered as a good product, thus improving the yield.

It is preferable that the second step further includes: dividing the multifanout signals, among signals supplied to a flip-flop circuit, on a tree, and the third step includes; calculating a driving ability of the transistors belonging to the tree as a delay time based on the information on the voltage drop value; calculating the resistance value and the capacitance value so that the delay time from a signal source to a signal receiving edge matches the delay time calculated as the driving ability of the transistors; and carrying out wiring between the signal source and the transistors belonging to the tree and between the signal source and the signal receiving edge so as to obtain the calculated resistance value and the capacitance value.

It is advantageous because it is possible to calculate the difference of signal delay time in consideration of the voltage drop and to carry out the wiring process so as not to generate a difference in the delay time, thereby enabling the difference of delay time generated at the time of using a LSI to approximate to zero and an unexpected operation abnormality to be avoided in advance.

In an apparatus for designing a semiconductor integrated circuit device, a re-arrangement means for arranging transistors based on information on the voltage drop value is provided. With such a configuration, it is possible to carry out the arrangement of cells in consideration of the increase in delay of cells due to a voltage drop. As compared with a conventional method in which a delay calculation is carried out in consideration of a voltage drop value after cells are arranged, the apparatus according to the embodiment makes it possible to carry out a circuit optimization process for timing correction at the stage of arrangement and to shorten the designing time.

In this embodiment, it is preferable that the voltage drop value information producing means includes: a schematic wiring means for carrying out a schematic wiring for connecting between the transistors which are schematically arranged; a power consumption calculation means for calculating a power consumption by estimating wiring capacitance based on the schematic wiring and by calculating load capacitance of each of the transistors; a resistance value extraction means for determining a resistance value of wired power source/ground wiring; a voltage drop value calculation means for calculating a voltage drop value from a power supply source in the case where an electric current source is connected to the resistance value of the wired power source/ground wiring based on the calculated power consumption; and a voltage drop value distribution production means for determining a voltage drop distribution in the semiconductor integrated circuit device based on the calculated voltage drop value.

It is preferable that the rearrangement means arranges the appropriate transistors in a place in which an arbitrary voltage drop value is assumed based on the voltage drop distribution.

It is preferable that the re-arrangement means arranges an entire path between flip-flops or a pair of a flip-flop at the source side and a flip-flop at the sink side in the semiconductor integrated circuit device in a region in which a difference of voltage drop value is small based on information on the voltage drop value.

It is preferable that the voltage drop value information production means further includes: a path delay calculation means for calculating a path delay between flip-flops based on the schematic arrangement of the transistors and the schematic wiring; and a path delay margin calculation means for comparing the calculated path delay with a limit delay time so as to determine a margin of the path delay in the path between the flip-flops. In the apparatus, it is preferable that the re-arrangement means preferentially arranges the transistors included in the path having a large margin of the path delay in a region in which a voltage drop value is large.

It is preferable that the voltage drop value information production means further includes: a test circuit built-in means for building-in the test circuit for detecting a failure place of the transistor. In the apparatus, it is preferable that the re-arrangement means changes the order of connecting the test circuit based on the information on the voltage drop value.

Hereinafter, embodiments of the present invention will be explained with reference to drawings.

(First Embodiment)

Figure 1:
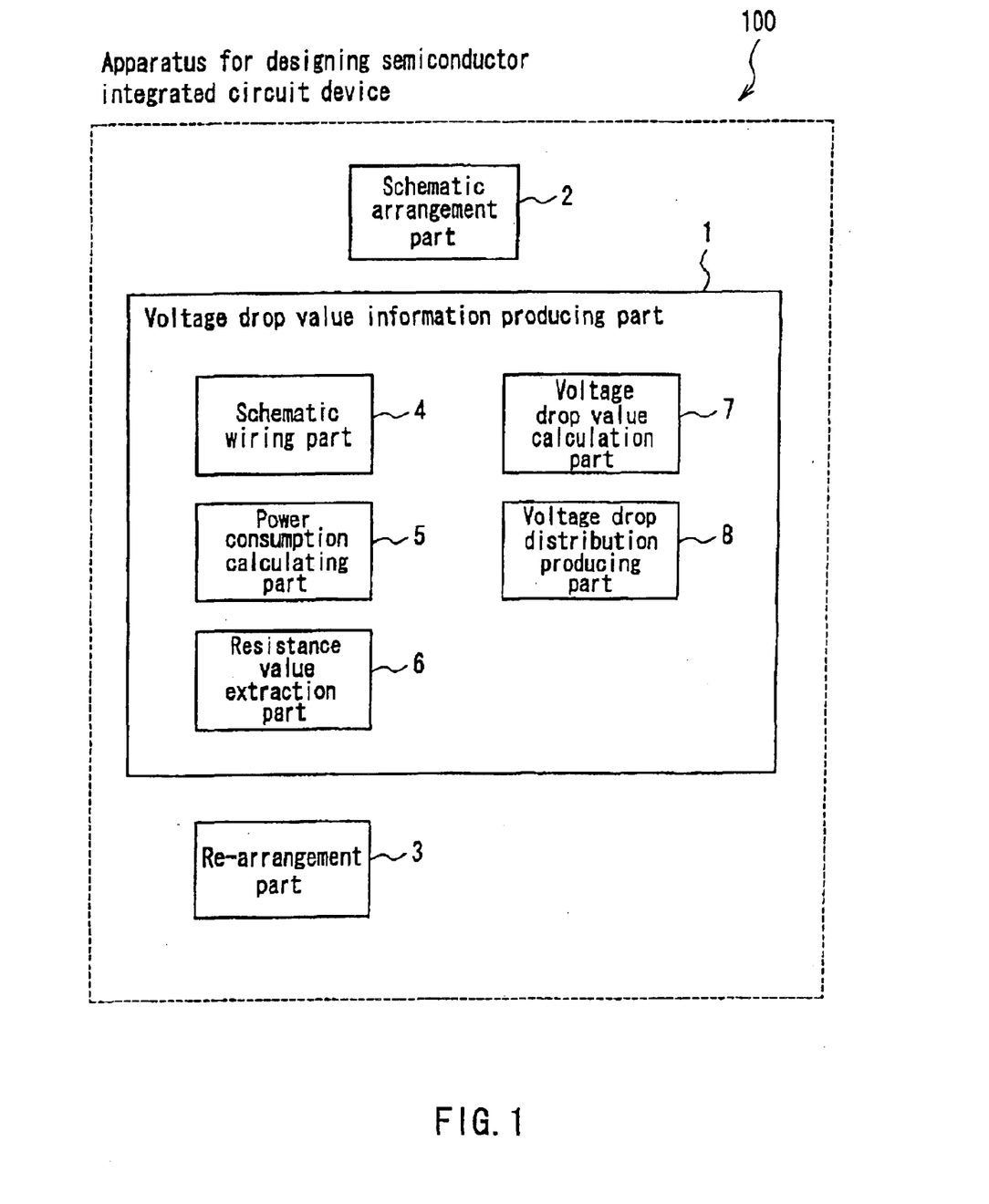
FIG. 1 is a block diagram showing a configuration of an apparatus 100 for designing a semiconductor integrated circuit device according to a first embodiment of the present invention.

FIG. 1 is a block diagram showing a configuration of an apparatus 100 for designing a semiconductor integrated circuit device according to a first embodiment of the present invention. The apparatus 100 connects between terminals of transistors formed on a silicon wafer by metal wiring. The apparatus 100 is provided with a schematic arrangement part 2. The schematic arrangement part 2, to which information on transistors is input, carries out a schematic arrangement so that a wiring distance between the connected transistors and wiring capacitance are minimized. The apparatus 100 is provided with a voltage drop value information producing part 1. The voltage drop value information producing part 1 produces information on a voltage drop value based on the schematic arrangement of transistors by the schematic arrangement part 2.

The voltage drop value information producing part 1 includes a schematic wiring part 4. The schematic wiring part 4 carries out a schematic wiring for connecting between the transistors that are schematically arranged by the schematic arrangement part 2. The voltage drop value information producing part 1 is provided with a power consumption calculation part 5. The power consumption calculation part 5 calculates power consumption by estimating the wiring capacitance based on the schematic wiring by the schematic wiring part 4 and by calculating the load capacitance of each transistor. The voltage drop value information producing part 1 has a resistance value extraction part 6. The resistance value extraction part 6 determines the resistance value of the wired power source/ground wiring. The voltage drop value information producing part 1 is provided with a voltage drop value calculation part 7. The voltage drop value calculation part 7 calculates a voltage drop value from a power supply source when an electric current supply is connected to the resistance value of the wired current/ground wiring based on the calculated power consumption. The voltage drop value information producing part 1 has a voltage drop distribution producing part 8. The voltage drop distribution producing part 8 obtains the distribution of a voltage drop in the semiconductor integrated circuit device based on the calculated voltage drop value.

The apparatus 100 is provided with a re-arrangement part 3. The re-arrangement part 3 arranges transistors based on the information on the voltage drop value produced by the voltage drop value information producing part 1.

Figure 2:
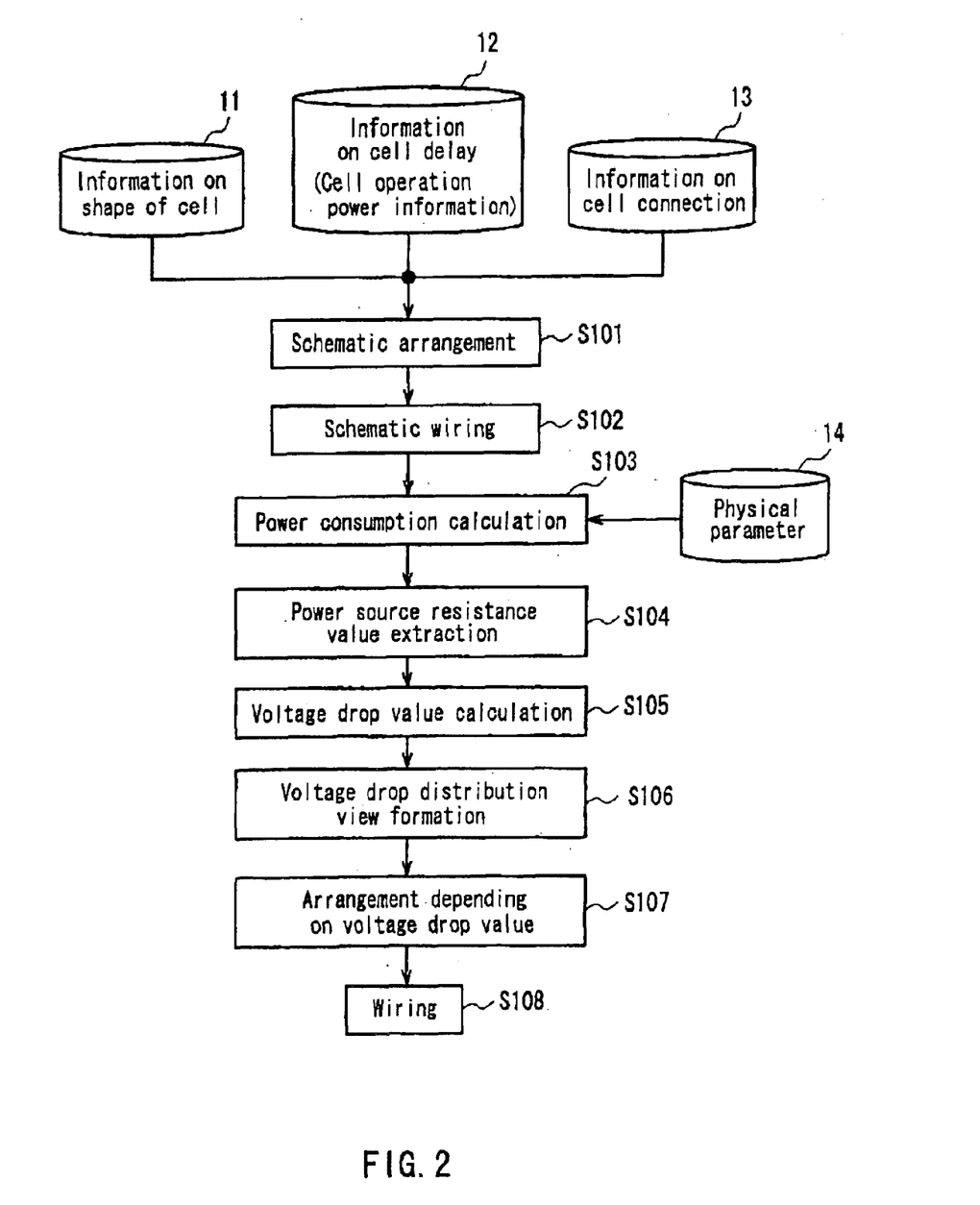
FIG. 2 is a flowchart showing a process in a method for designing a semiconductor integrated circuit device according to the first embodiment.

The operation of the apparatus 100 having the above-mentioned configuration will be explained. FIG. 2 is a flowchart showing a process in a method for designing a semiconductor integrated circuit device according to a first embodiment of the present invention.

In FIG. 2, firstly, information 11 on the shape of a cell, information 12 on the delay of a cell (information on an operation power of cell, and information 13 on the connection of cells, etc. are input, and then the schematic arrangement process is carried out so that the wiring distance for connecting cells or wiring capacitance is minimized (step S101). Then, a schematic wiring process for connecting cells that are schematically arranged is carried out (step S102). At this time, in addition to the signal wiring, the wiring process of power source and wiring of ground are also carried out.

Next, based on the result of the schematic wiring process, the wiring capacitance is estimated based on a wiring length and wiring capacitance information stored as a physical parameter 14 and the load capacitance of each cell is calculated, and thereby the power consumption is calculated (step S103). Then, the resistance value of the wiring power source/ground wiring is determined by using information stored in the physical parameter 14 such as a sheet resistance (step S104). Note here that the resistance value to be calculated is determined in a form corresponding to the connection information of wiring form.

Next, the amount of a voltage drop from the power supply source is calculated from the calculated power consumption assuming that an electric current source is connected to the resistance value of the wiring power source/ground wiring (step S105). Then, based on the calculated voltage drop value and information of placement coordinate of cells, voltage drop values are written in the place corresponding to each coordinate in a matrix database shown in FIG. 3 divided by an arbitrary number on a LSI chip (step S106).

Figure 3:
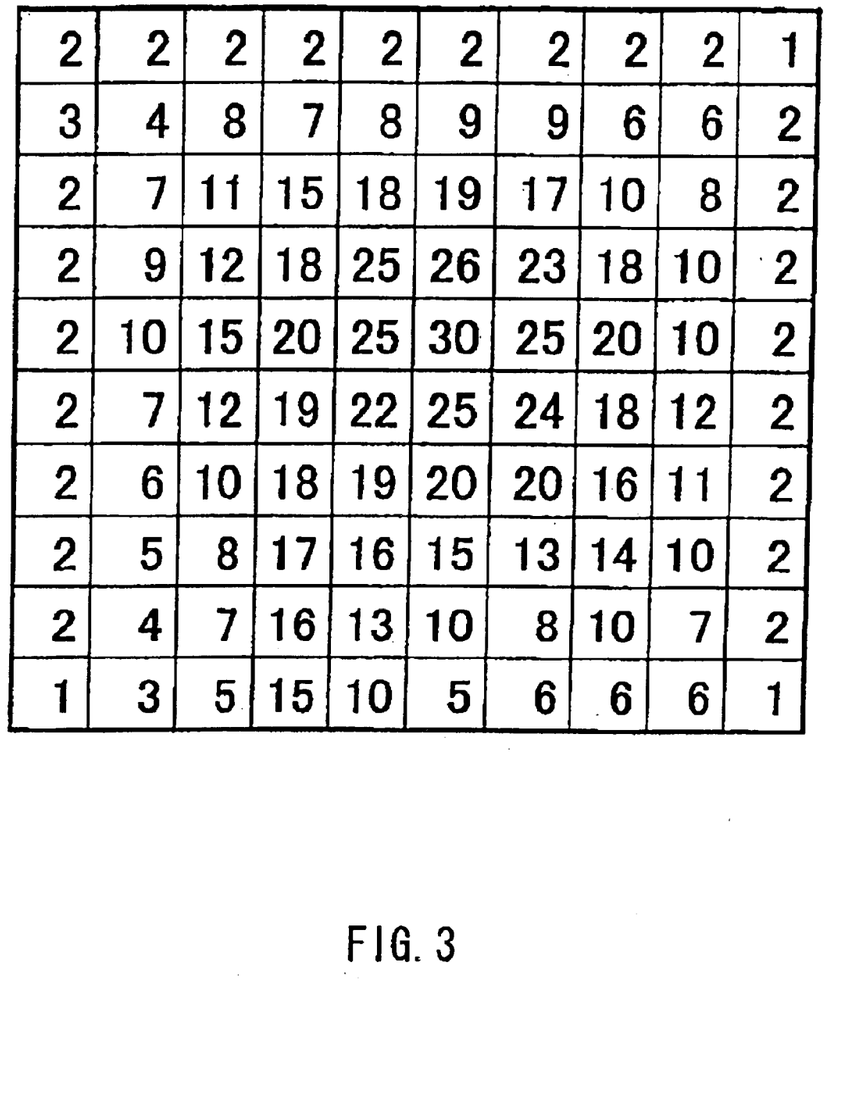
FIG. 3 is a view showing an example of matrix values showing a voltage drop distribution in the method for designing a semiconductor integrated circuit device according to the first embodiment.
Figure 4:
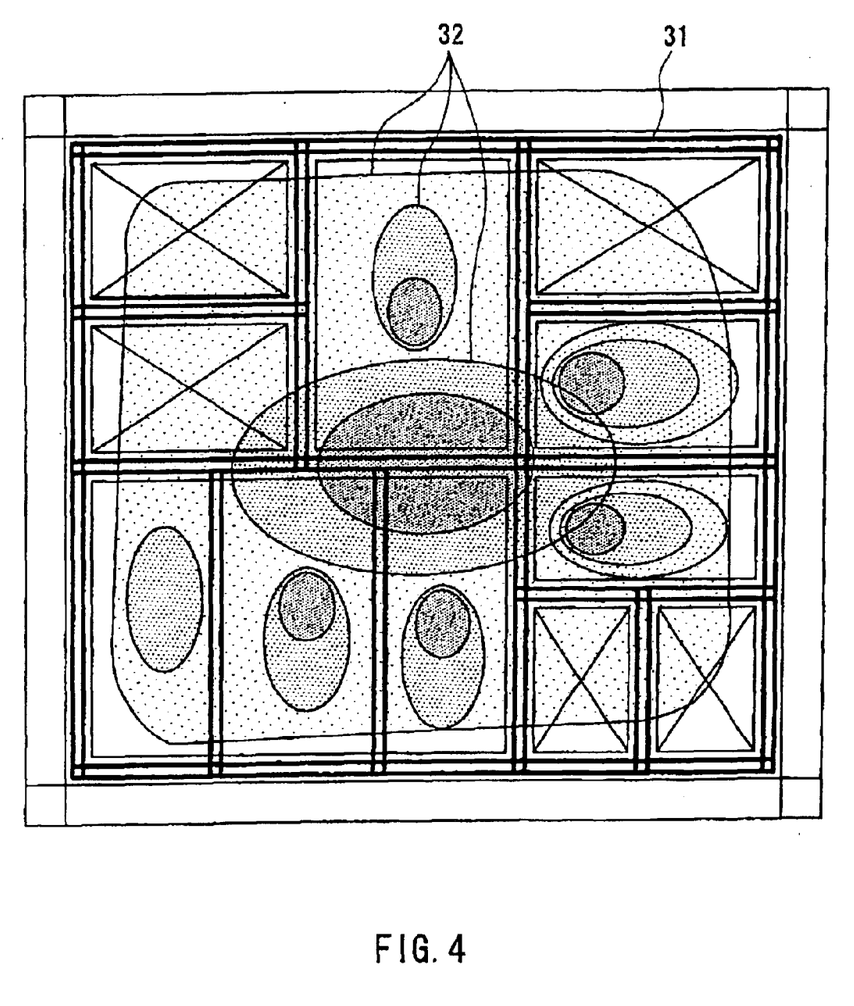
FIG. 4 is an image view showing a voltage drop distribution on a LSI chip in the method for designing a semiconductor integrated circuit device according to the first embodiment.

FIG. 3 is a view showing an example of matrix values showing the distribution of a voltage drop in a method for designing a semiconductor integrated circuit device according to the first embodiment of the present invention. In FIG. 3, numbers show voltage drop values, and by determining the size of the matrix so as to have such a sufficient resolution that exhibits a voltage drop value in accordance with the size of the wiring resistance value or the size of a chip and number of cells, it is possible to make an effective use of the voltage drop distribution by the matrix. FIG. 4 shows an image view showing the change of the matrix values of the voltage drop distribution.

FIG. 4 is an image view of a voltage drop distribution on a LSI chip in a method for designing a semiconductor integrated circuit device according to the first embodiment of the present invention. In FIG. 4, a bold line denotes a power source wiring 31 and in the LSI chip, the shapes like contour lines are drawn.

Like a general contour line, this contour line shows an equipotential line 32 obtained by connecting portions having a certain voltage drop value. In order to show a region having a certain range of voltage, a region surrounded by the equipotential line 32 is shown by gray scale levels. It is shown that the higher the intensity of gray is, the larger the voltage drop value becomes.

Next, based on the produced distribution of the voltage drop, appropriate cells are arranged in a place where an arbitrary voltage drop value is assumed (step S107). Then, a wiring process for connecting between terminals of cells is carried out (step S108).

As mentioned above, according to the first embodiment, before the final arrangement process is carried out, a schematic arrangement process is carried out and then the voltage drop value is predicted. Thus it is possible to, carry out the arrangement and wiring process in light of prediction of the deterioration of the operation performance of cells (transistors). Thus, it is possible to reduce a backward process for correcting a floor plan later in accordance with the influence of a voltage drop and to develop a LSI chip in a shorter designing time.

(Second Embodiment)

Figure 5:
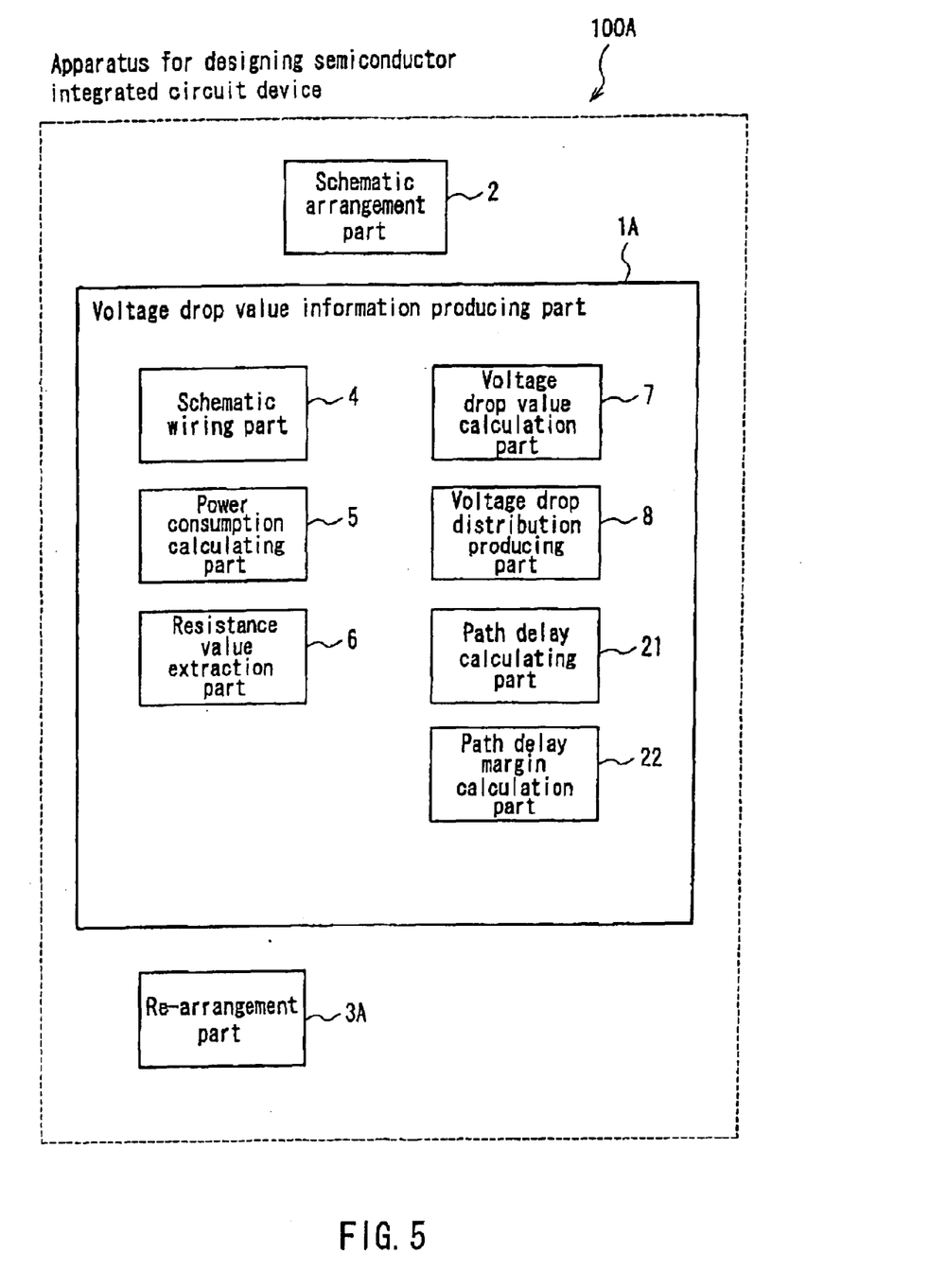
FIG. 5 is a block diagram showing a configuration of an apparatus for designing a semiconductor integrated circuit device according to a second embodiment of the present invention.

FIG. 5 is a block diagram showing a configuration of an apparatus 100A for designing a semiconductor integrated circuit device according to a second embodiment of the present invention. The same component elements as those of the apparatus 100 for designing a semiconductor integrated circuit device explained with reference to FIG. 1 in the first embodiment are given the same reference numbers, respectively, and a detailed explanation therefor is omitted herein.

The apparatus 100A is provided with a voltage drop value information producing part 1A. The voltage drop value information producing part 1A has a path delay calculation part 21. The path delay calculation part 21 calculates a path delay between flip-flops based on the schematic arrangement of transistors and schematic wiring. The voltage drop value information producing part 1A is provided with a path delay margin calculation part 22. The path delay margin calculation part 22 determines a margin of the path delay in the path between the flip-flops by comparing the path delay calculated by the path delay calculation part 21 with a limit delay time.

The apparatus 100A is provided with a re-arrangement part 3A. The re-arrangement part 3A arranges transistors, which are included in a path with a large margin of path delay calculated by the path delay margin calculation part 22 preferentially, in a region in which a value of volume drop is large.

Figure 6:
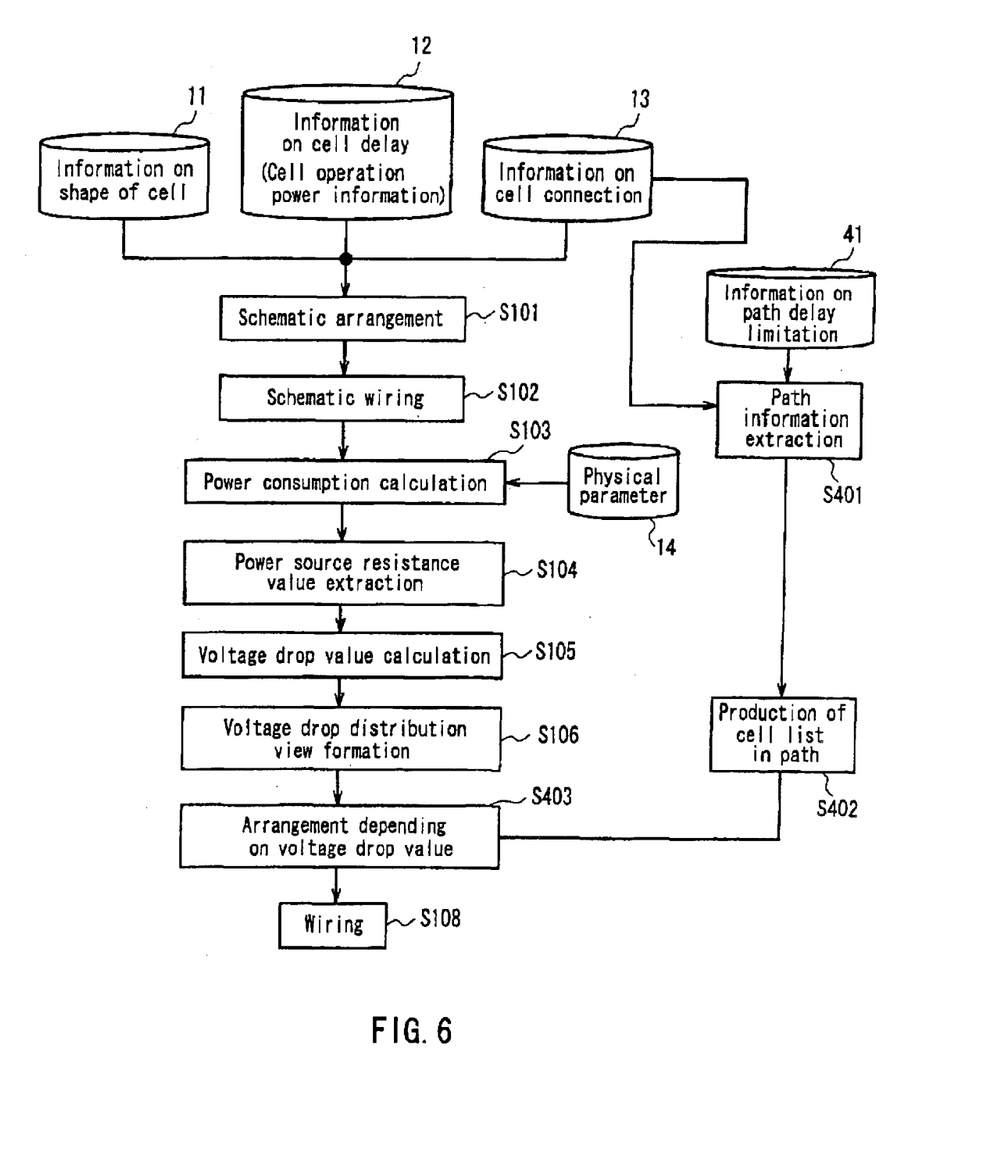
FIG. 6 is a flowchart showing a process in a method for designing a semiconductor integrated circuit device according to the second embodiment.

The operation of the apparatus 100A having the above-mentioned configuration will be explained. FIG. 6 is a flowchart showing a process in a method for designing a semiconductor integrated circuit device according to a second embodiment of the present invention. In the steps of FIG. 6, steps of carrying out the same processes as in the first embodiment are given the same step numbers as in FIG. 2 and a detailed explanation therefor is omitted.

In FIG. 6, firstly, since steps from S101 to S106 are the same processes as in the first embodiment, an explanation therefor is omitted. Next, after a voltage drop distribution view is formed (step S106), information 13 on connection of cells and path delay limitation information 41 that is a designing condition are read in, the paths included in the information 13 on connection of cells but not related to the circuit operation are excluded, and cell information included in remaining paths is extracted (step S401) so as to produce a cell list in a path (step S402).

Then, cells included in each path in the cell list in path are arranged so that they fall in a certain range of voltage drop values from the voltage drop distribution view (step S403), and then a wiring process for connecting between the terminals of cells is carried out (step S108).

As mentioned above, according to the second embodiment, by making each path have a certain voltage drop value, the path delay calculation can be calculated at a certain voltage drop value. Even when an electrostatic timing analysis is carried out, it is possible to carry out a delay calculation in consideration of the voltage drop value at high speed.

(Third Embodiment)

Figure 7:
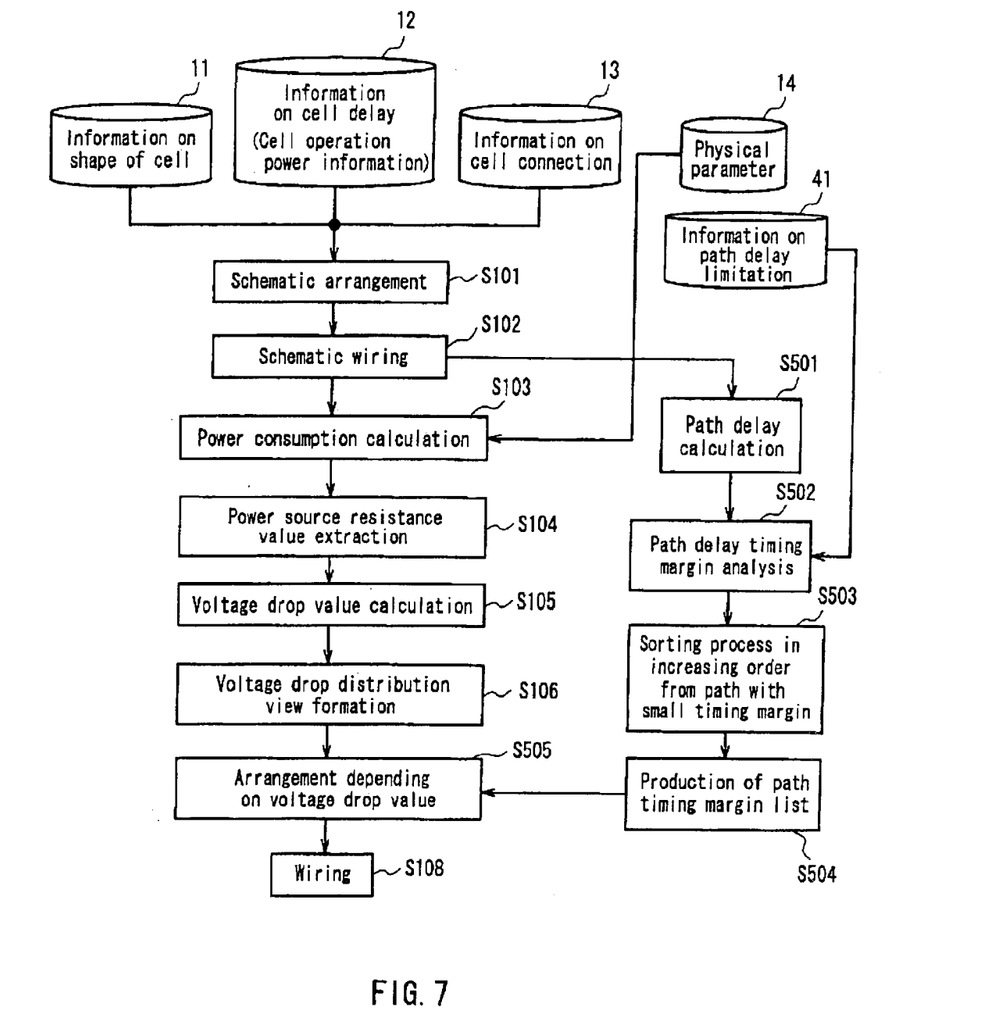
FIG. 7 is a flowchart showing a process in a method for designing a semiconductor integrated circuit device according to a third embodiment of the present invention.

Hereinafter, a method for designing a semiconductor integrated circuit device according to a third embodiment of the present invention will be explained with reference to a drawing. FIG. 7 is a flowchart showing a process in a method for designing a semiconductor integrated circuit device according to a third embodiment of the present invention. In the steps of FIG. 7, steps of carrying out the same processes as in the first embodiment are given the same step numbers as in FIG. 2 and a detailed explanation therefor is omitted. The method for designing a semiconductor integrated circuit device is carried out by the apparatus 100A for designing a semiconductor integrated circuit device explained with reference to FIG. 5.

In FIG. 7, firstly, since step S101 and step S102 are the same processes as in the first embodiment, the explanation therefor is omitted. Then, after the schematic wiring process is carried out (step S102), the wiring capacitance and wiring resistance are extracted based on the schematic wiring information, and the path delay between flip-flops is calculated (step S501).

Next, by reading a timing limit information on the path delay between flip-flops, and comparing it with the calculated path delay time, a timing margin time in each path is analyzed (step S502). Then, a sorting process is carried out in increasing order from path with a smaller timing margin time (step S503) so as to form a path timing margin list (step S504). Thereafter, in the steps S103 to S106, the same process as in the first embodiment is carried out so as to form a voltage drop distribution view.

After the voltage drop distribution view is formed (step S106), paths are placed sequentially in regions from a region with a smaller voltage drop value in increasing order of voltage drop values in the formed path timing margin list. At this time, paths are placed sequentially in order from a path located at the head (step S505). Herein, when the arrangement process is carried out, also the head path to be arranged and another path including the last flop-flop are necessary to be arranged in considering that the connecting paths are not so far away from each other.

Finally, by carrying out the wiring process between terminals of arranged cells, the designing is completed (step S108).

As mentioned above, according to the third embodiment, by placing paths sequentially in increasing order from a path with a smaller path timing margin in a region with less voltage drop, it is possible to carry out designs that are less susceptible to the deterioration in the transistor operation performance due to a voltage drop in the path in which a timing is the most strict. Thus, it is possible to prevent the performance of LSI from being deteriorated due to a voltage drop.

(Fourth Embodiment)

Figure 8:
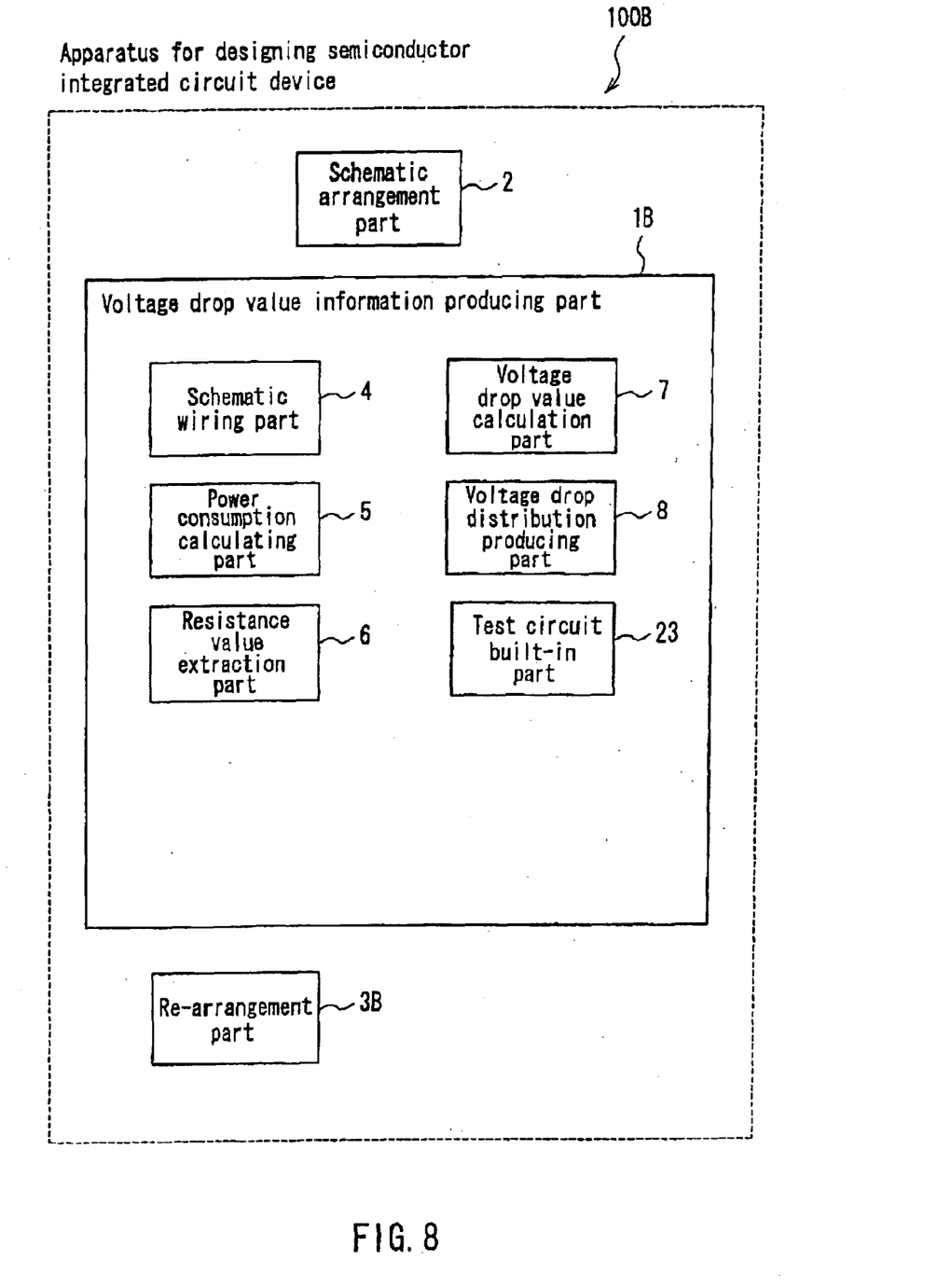
FIG. 8 is a block diagram showing a configuration of an apparatus for designing a semiconductor integrated circuit device according to a fourth embodiment of the present invention.

FIG. 8 is a block diagram showing a configuration of an apparatus 100B for designing a semiconductor integrated circuit device according to a fourth embodiment of the present invention. The same component elements as the component elements of the apparatus 100 for designing a semiconductor integrated circuit device explained with reference to FIG. 1 in the first embodiment are given the same reference numbers and a detailed explanation therefor is omitted herein.

The apparatus 100B is provided with a voltage drop value information producing part 1B. The voltage drop value information producing part 1B has a test circuit built-in part 23. The test circuit built-in part 23 is provided for detecting failures of transistors. The apparatus 100B has a re-arrangement part 3B. The re-arrangement part 3B changes the connection order of the test circuit based on information on voltage drop values.

Figure 9:
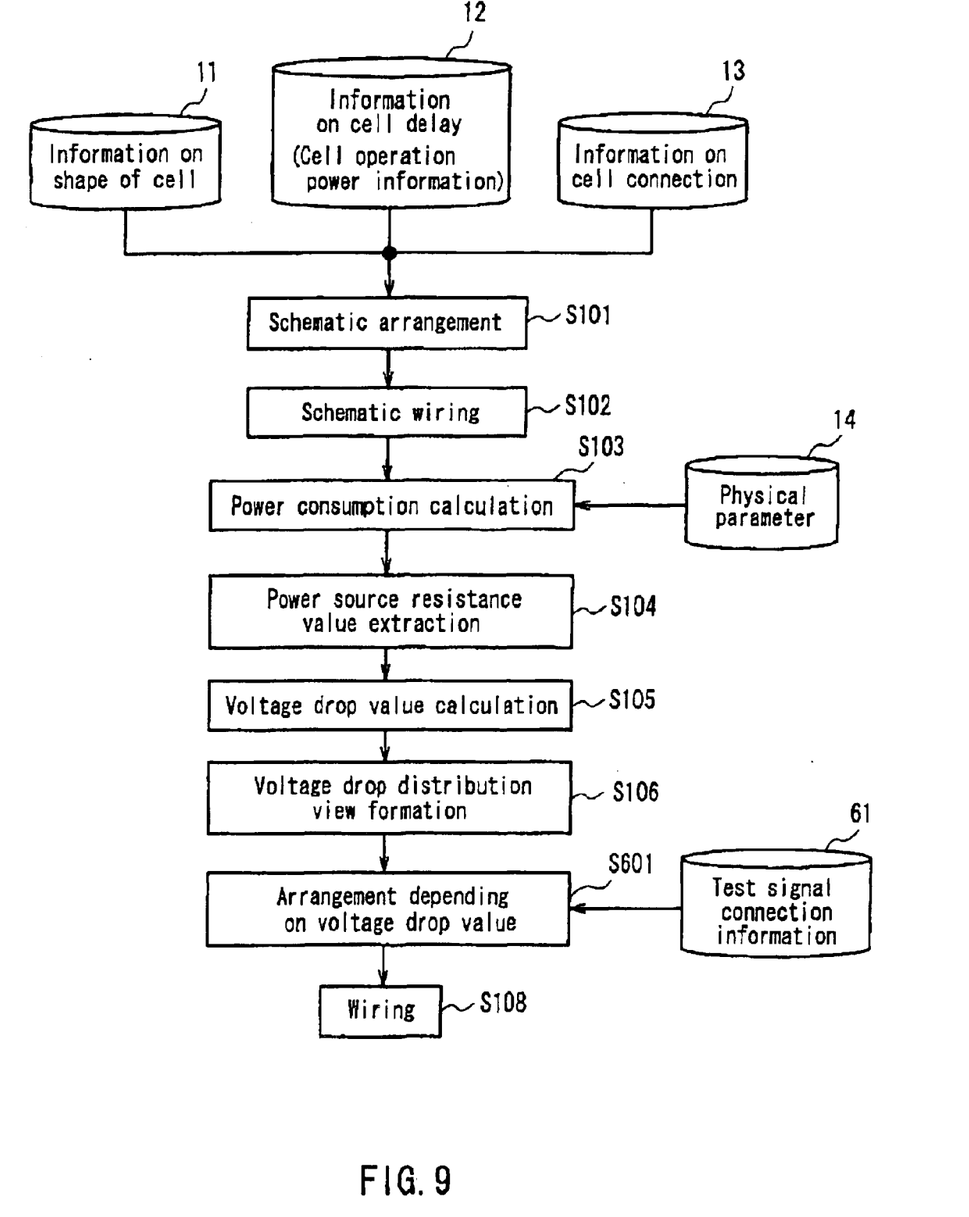
FIGS. 9 and 10 are flowcharts respectively showing a process in the method for designing a semiconductor integrated circuit device according to a fourth embodiment of the present invention.
Figure 10:
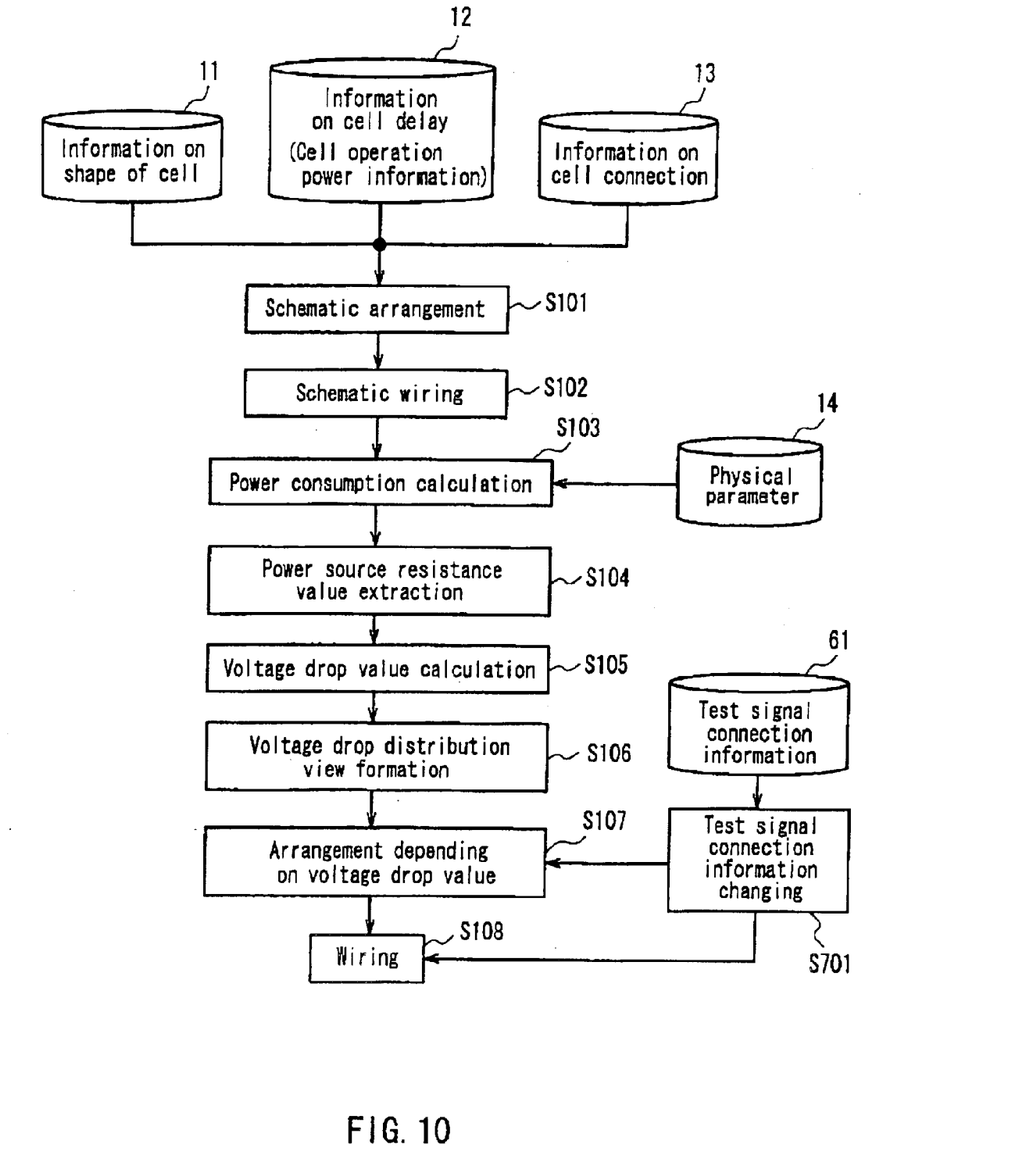

The operation of the apparatus 100B having this configuration will be explained. FIGS. 9 and 10 are flowcharts respectively showing a process in a method for designing a semiconductor integrated circuit device according to a fourth embodiment of the present invention. In each step of FIGS. 9 and 10, steps of carrying out the same processes as in the first embodiment are given the same step numbers as in FIG. 2 and a detailed explanation therefor is omitted.

In FIGS. 9 and 10, firstly, since steps from S101 to S106 are the same processes as in the first embodiment, an explanation therefor is omitted. Next, after a voltage drop distribution view is formed (step S106), test signal connection information 61 in a failure detection test circuit is read. Then, the arrangement process is carried out in accordance with the voltage drop distribution view so that the flip-flop at the side transmitting a test signal always has a lower electric potential than the electric potential at the side receiving a test signal based on the test signal connection information 61 (step S601). Finally, the connection wiring process between the terminals of each cell is carried out (step S108).

In general, since a test circuit connects between flop-flops directly with each other or with a path shorter than that of the general logic circuit, when the time obtained by adding the hold time limitation of the data signal of flip-flop and the delay time for test signal between flip-flops is shorter than the difference (clock skew) of delay time in which a clock signal reaches the flip-flop cell, the problem of hold error occurs, and the troubleshooting of a LSI chip cannot be carried out. However, according to the fourth embodiment, the voltage value of cells at the side transmitting a test signal is always lower than the voltage value of cells at the side receiving the signal. Therefore, the delay time of test signal is increased, thus enabling the hold error to be prevented in advance.

Furthermore, in FIG. 9, the arrangement process is carried out in consideration of the voltage drop distribution and test signal connection information 61 before arrangement. However, as shown in FIG. 10, after the arrangement process is finished, based on the voltage drop distribution and the test signal information 61, the order of connecting a test signal may be changed so that the electric potential of cells at the side transmitting signal is lower than the electric potential of cells at the side receiving signal (step S701).

(Fifth Embodiment)

Figure 11:
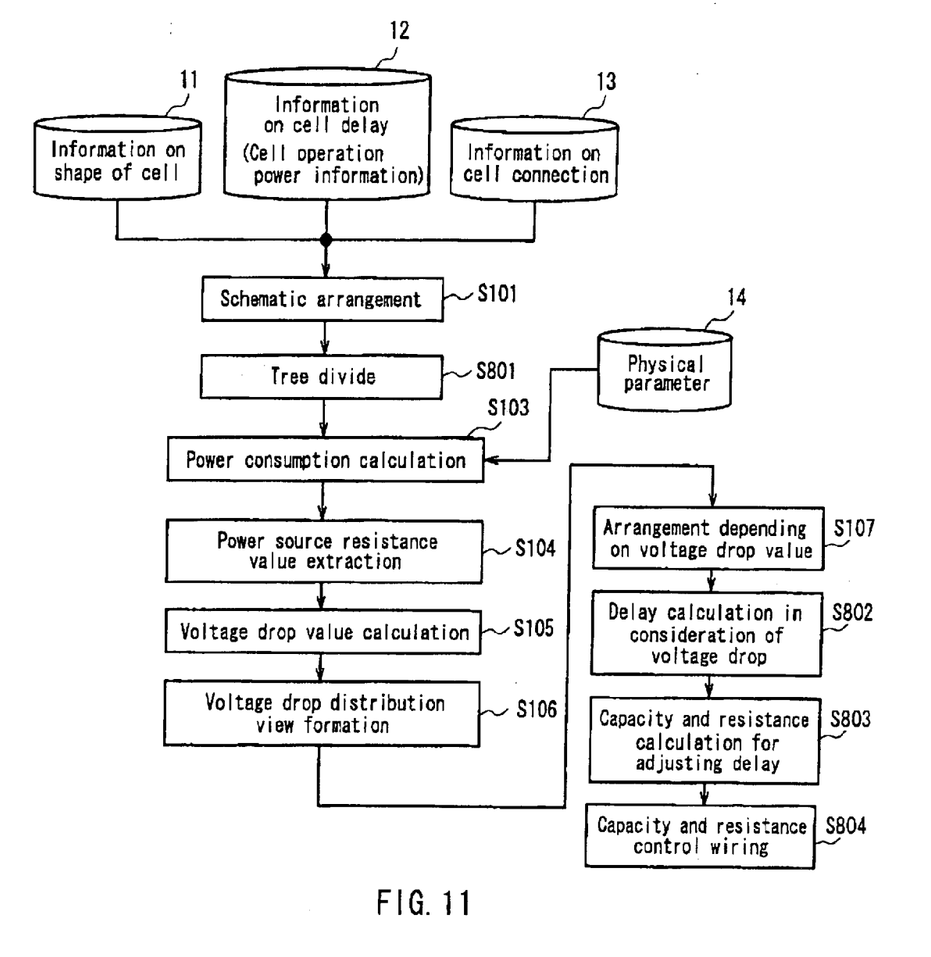
FIG. 11 is a flowchart showing a process in a method for designing a semiconductor integrated circuit device according to a fifth embodiment of the present invention.

Hereinafter, a method for designing a semiconductor integrated circuit device according to a fifth embodiment of the present invention will be explained with reference to a drawing. FIG. 11 is a flowchart showing a process in the method for designing a semiconductor integrated circuit device according to the fifth embodiment of the present invention. In each step of FIG. 11, steps of carrying out the same processes as in the first embodiment are given the same step numbers as in FIG. 2 and a detailed explanation therefor is omitted.

In FIG. 11, firstly, information similar to that of the first embodiment is read so as to carry out the schematic arrangement process (step S101). Next, a multifanout signal, for example, a clock signal, reset signal, etc., in which a large number of cells are driven by one cell in the information on the connection of cells, are divided on a tree (clock tree sequence process) by using buffer cells or inverter cells in the even number stages (step S801), and then the process until the arrangement process of inserted cells is carried out.

Then, in the steps from S103 to S107, the voltage drop distribution view is formed similarly to the first embodiment, and based on the voltage drop distribution view, processes until the process for arranging cells are executed in sequence. Next, by considering the deterioration of the driving ability of cells depending upon a voltage drop value, a delay calculation process of clock tree inserted in the step S801 is carried out (step S802).

Then, the calculation of the wiring capacitance and the resistance value for combining the delay time from the signal source of the calculated clock tree to the edge of receiving signal such as flip-flop, etc. (step S803). Next, wiring is carried out sequentially from the wiring of the dock tree so as to be the calculated wiring capacitance and the resistance value (step S804).

As mentioned above, according to the fifth embodiment, in consideration of the reduction in the operation speed of cells due to the voltage drop, by carrying out wiring process so that the skew of the clock tree is reduced, it is possible to suppress the operation speed of cells included in the signal route in the path between flip-flops and at the same time, it is possible to suppress the reduction in the operation speed of circuit operation due to the clock skew.

As mentioned above, according to the method for designing a semiconductor circuit device of the first to fifth embodiments, in designing process of layout of LSI, schematic arrangement or schematic wiring is carried out before final arrangement or arrangement process is carried out. Then, based on the results of the schematic arrangement or schematic wiring, a voltage drop value occurring after the final arrangement of cells or final wiring process is predicted, so that arrangement and wiring process are carried out based on the predicted drop value. Thus, it is possible to cope with the deterioration of the performance of each transistor due to a voltage drop at the time of operation of the LSI chip in simulation, and to improve the yield.

The invention may be embodied in other specific forms without departing from the spirit or essential characteristics thereof. The embodiments disclosed in this application are to be considered in all respects as illustrative and not restrictive, the scope of the invention being indicated by the appended claims rather than by the foregoing description, all changes that come within the meaning and range of equivalency of the claims are intended to be embraced therein.

What is claimed is:

1. A method for designing a semiconductor integrated circuit device for connecting between terminals of transistors formed on a silicon wafer by metal wiring, the method comprising:
   a first step of carrying out a schematic arrangement so as to minimize a distance of a wiring for connecting between the transistors or wiring capacitance based on input information on the transistors;
   a second step of producing information on a voltage drop value based on the schematic arrangement of the transistors; and
   a third step of arranging the transistors based on the information on the voltage drop value.

2. The method for designing a semiconductor integrated circuit device according to claim 1, wherein the second step comprises:
   carrying out a schematic wiring for connecting between the transistors which are schematically arranged;
   calculating a power consumption by estimating wiring capacitance based on the schematic wiring and by calculating load capacitance of each of the transistors;
   determining a resistance value of wired power source/ground wiring;
   calculating a voltage drop value from a power supply source in the case where an electric current source is connected to the wired power source/ground wiring based on the resistance value of the wired power source/ground wiring and the calculated power consumption; and
   determining a voltage drop distribution in the semiconductor integrated circuit device based on the calculated voltage drop value.

3. The method for designing a semiconductor integrated circuit device according to claim 2, wherein the third step comprises: arranging the appropriate transistors in a place in which an arbitrary voltage drop value is assumed, based on the voltage drop distribution.

4. The method for designing a semiconductor integrated circuit device according to claim 1, wherein the third step comprises: arranging an entire path between flip-flops or a pair of a flip-flop at the source side and a flip-flop at the sink side in the semiconductor integrated circuit device in a region in which a difference of voltage drop values is small, based on information on the voltage drop value.

5. The method for designing a semiconductor integrated circuit device according to claim 1, further comprising:
   carrying out a schematic wiring for connecting the transistors which are schematically arranged;
   calculating the path delay between flip-flops based on the schematic arrangement of the transistors and the schematic wiring; and
   comparing the calculated path delay with a limit delay time so as to determine a margin of the path delay in the path between the flip-flops,
   wherein the third step comprises: preferentially arranging the transistors included in the path having a large margin of the path delay in a region in which a voltage drop value is large.

6. The method for designing a semiconductor integrated circuit device according to claim 1, further comprising: building-in a test circuit for detecting a failure place of the transistor,
   wherein the third step comprises changing the order of connecting the test circuit based on information on the voltage drop value.

7. The method for designing a semiconductor integrated circuit device according to claim 1, wherein
   the second step further comprises:
   dividing multifanout signals, among signals supplied to a flip-flop circuit, on a tree, and
   the third step comprises:
   calculating a driving ability of the transistors belonging to the tree as a delay time based on the information on the voltage drop value;
   calculating the resistance value and the capacitance value so that the delay time from a signal source to a signal receiving edge matches to the delay time calculated as the driving ability of the transistors;
   carrying out wiring between the signal source and the transistors belonging to the tree and between the signal source and the signal receiving edge so as to obtain the calculated resistance value and the capacitance value.

8. An apparatus for designing a semiconductor integrated circuit device for connecting between terminals of transistors formed on a silicon wafer by metal wiring, comprising:
   a schematic arrangement means for carrying out a schematic arrangement so as to minimize a distance of a wiring for connecting between the transistors or wiring capacitance based on input information on the transistors;
   a voltage drop value information producing means for producing information on a voltage drop value based on the schematic arrangement of the transistors; and
   a re-arrangement means for arranging the transistor based on the information on the voltage drop value.

9. The apparatus for designing a semiconductor integrated circuit device according to claim 8, wherein the voltage drop value information producing means comprises:
   a schematic wiring means for carrying out a schematic wiring for connecting between the transistors which are schematically arranged;
   a power consumption calculation means for calculating a power consumption by estimating wiring capacitance based on the schematic wiring and by calculating load capacitance of each of the transistors;
   a resistance value extraction means for determining a resistance value of wired power source/ground wiring;
   a voltage drop value calculation means for calculating a voltage drop value from a power supply source in the case where an electric current source is connected to the wired power source/ground wiring based on the resistance value of the wired power source/ground wiring and the calculated power consumption; and
   a voltage drop value distribution production means for determining a voltage drop distribution in the semiconductor integrated circuit device based on the calculated voltage drop value.

10. The apparatus far designing a semiconductor integrated circuit device according to claim 9, wherein the re-arrangement means arranges the appropriate transistors in a place in which an arbitrary voltage drop value is assumed based on the voltage drop distribution.

11. The apparatus for designing a semiconductor integrated circuit device according to claim 9, wherein the re-arrangement means arranges an entire path between flip-flops or a pair of a flip-flop at the source side and a flip-flop at the sink side in the semiconductor integrated circuit device in a region in which a difference of voltage drop value is small based on information on the voltage drop value.

12. The apparatus for designing a semiconductor integrated circuit device according to claim 9, wherein the voltage drop value information production means further comprises:
  a path delay calculation means for calculating a path delay between flip-flops based on the schematic arrangement of the transistors and the schematic wiring; and
  a path delay margin calculation means for comparing the calculated path delay with a limit delay time so as to determine a margin of the path delay in the path between the flip-flops,
  wherein the re-arrangement means preferentially arranges the transistors included in the path having a large margin of the path delay in a region in which a voltage drop value is large.

13. The apparatus for designing a semiconductor integrated circuit device according to claim 9, wherein the voltage drop value information production means further comprises: a test circuit built-in means for building-in the test circuit for detecting a failure place of the transistor,
  wherein the re-arrangement means changes the order of connecting the test circuit based on the information on the voltage drop value.

* * * * *